United States Patent
Kim (10) Patent No.: US 8,207,535 B2
(45) Date of Patent: Jun. 26, 2012

(54) THIN FILM TRANSISTOR SUBSTRATE AND FABRICATING METHOD THEREOF

(75) Inventor: Hyun-Ho Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/879,949

(22) Filed: Sep. 10, 2010

(65) Prior Publication Data

US 2010/0327283 A1    Dec. 30, 2010

Related U.S. Application Data (62) Division of application No. 11/964,600, filed on Dec. 26, 2007, now Pat. No. 7,816,192.

(30) Foreign Application Priority Data

Dec. 28, 2006 (KR) .................. 10-2006-0137120

(51) Int. Cl.
| | |
|---|---|
| H01L 29/04 | (2006.01) |
| H01L 29/10 | (2006.01) |
| H01L 31/00 | (2006.01) |
| H01L 21/84 | (2006.01) |
| G02F 1/1335 | (2006.01) |

(52) U.S. Cl. ........... 257/59; 257/E29.151; 257/E21.414; 438/158; 438/160; 349/67; 349/113; 349/114; 349/115

(58) Field of Classification Search .................. 257/59, 257/E21.414, E29.003, E29.151; 438/160, 438/158; 349/67, 113–115

See application file for complete search history.

(56) References Cited

U.S. PATENT DOCUMENTS

| | | | | |
|---|---|---|---|---|
| 6,291,146 | B1 * | 9/2001 | Chang et al. | 430/394 |
| 6,522,375 | B1 * | 2/2003 | Jang et al. | 349/113 |
| 2002/0113927 | A1 * | 8/2002 | Ha et al. | 349/113 |
| 2003/0142247 | A1 * | 7/2003 | Nishiyama et al. | 349/67 |
| 2004/0125289 | A1 * | 7/2004 | Nam et al. | 349/114 |
| 2007/0040971 | A1 * | 2/2007 | Maekawa et al. | 349/122 |
| 2007/0153170 | A1 * | 7/2007 | Yao | 349/113 |

FOREIGN PATENT DOCUMENTS

| | | |
|---|---|---|
| TW | 200401145 A | 1/2004 |
| TW | 200532334 A | 10/2005 |

* cited by examiner

*Primary Examiner* — Zandra Smith
*Assistant Examiner* — Jeremy Joy
(74) *Attorney, Agent, or Firm* — Birch, Stewart, Kolasch & Birch, LLP (57) ABSTRACT

The present invention relates to a thin film transistor substrate. The thin film transistor according to one embodiment of the present invention comprises: a gate wire and a data wire formed to cross each other on an insulating substrate and define a pixel area; a thin film transistor formed on the intersection of the gate wire and the data wire; an inorganic insulating layer covering the thin film transistor and having a surface that a prominence and depression pattern formed on; and a reflective layer provided on the prominence and depression pattern. Thus, the present invention provides a thin film transistor substrate which reduces the time required in the process and enhance the productivity.

5 Claims, 5 Drawing Sheets

THIN FILM TRANSISTOR SUBSTRATE AND FABRICATING METHOD THEREOF

CROSS-REFERENCE TO RELATED APPLICATIONS

This application is a Divisional Application of Ser. No. 11/964,600 filed Dec. 26, 2007 now U.S. Pat. No. 7,816,192 which application claims the priority benefit of Korean Patent Application No. 10-2006-0137120, filed on Dec. 28, 2006, in the Korean Intellectual Property Office, the disclosures of each are incorporated herein by reference.

BACKGROUND OF THE INVENTION

1. Field of the Invention

The present invention relates to a thin film transistor substrate applied to a liquid crystal display device and a fabricating method thereof, and more particularly, to a thin film transistor substrate and a fabricating method thereof reduced the time required in the process and enhanced the productivity.

2. Description of the Related Art

Recently, a flat display device is widely used as a display device with benefits of thinner, lighter and less power consumption than a cathode ray tube (CRT). The flat display device comprises a liquid crystal display (LCD) and an organic light emitting diode (OLED).

Generally, the liquid crystal display device is divided in three types such as a transmitting type, a transreflective type and a reflective type according to the light source type. The transmitting type is a model that a backlight unit is disposed at the rear of the liquid crystal display panel, and light of the backlight unit is transmitted to the liquid crystal display panel. The reflective type is a model that natural light is reflected from the liquid crystal display panel, and the power consumption of the liquid crystal display device is reduced through restricting the use of the backlight unit occupying 70% of the power consumption. The transreflective type is a model that benefits of the transmitting type and the reflective type applied to, and light of the backlight unit is transmitted to the liquid crystal display panel and natural light is reflected from the liquid crystal display panel. Therefore, the transreflective type may keep adequate luminance for displaying independent on the change of the brightness around the liquid crystal display device.

A fabricating method of the reflective type liquid crystal display device and the transreflective type liquid crystal display device comprises steps of forming an organic passivation layer on a thin film transistor substrate, exposing the organic passivation layer by a mask, and developing the organic passivation layer, thereby forming a prominence and depression pattern. After forming the prominence and depression pattern, a reflective layer is formed on at least one part of the prominence and depression pattern. If the reflective layer is formed on the entire of the prominence and depression pattern, the reflective type is manufactured. If the reflective layer is formed on the one part of the prominence and depression pattern, the reflective type is manufactured.

However, the process for metal layers like a thin film transistor and the process for the organic passivation layer are different. Thus, the process for metal layers and the process for the organic passivation layer are underwent at the different places. Accordingly, metal layers like a thin film transistor are formed on the substrate in the place for forming metal layers, and the organic passivation layer is formed on the substrate after moving the substrate from the place for forming metal layers to the place for forming the organic passivation layer. After forming the prominence and depression pattern on the organic passivation layer, the substrate will be moved to the place for forming metal layers for the next stage and a pixel electrode and a reflective layer are formed on the organic passivation layer.

The above method of forming layers on the substrate by moving the substrate from the place to the other place is required a lot of time, thereby dropping the productivity. Moreover, the substrate and layers may be contaminated during moving the substrate, and faculties may be occurred due to the impact from shaking.

SUMMARY OF THE INVENTION

Accordingly, it is an aspect of the present invention to provide a thin film transistor substrate (and a display device having the thin film transistor substrate) and a fabricating method thereof, which reduce the time required in the process and enhance the productivity.

Additional aspects and/or advantages of the present invention will be set forth in part in the description which follows and, in part, will be obvious from the description, or may be learned by practice of the present invention.

The foregoing and/or other aspects of the present invention are also achieved by providing a thin film transistor substrate comprising according to an embodiment: a gate wire and a data wire formed to cross each other on an insulating substrate and define a pixel area; a thin film transistor formed on the intersection of the gate wire and the data wire; an inorganic insulating layer covering the thin film transistor and having a surface that a prominence and depression pattern formed on; and a reflective layer provided on the prominence and depression pattern.

According to an aspect of the present invention, the prominence and depression pattern is provided in at least one part of the pixel area.

According to an aspect of the present invention, the prominence and depression pattern is formed into an embossing shape, the ratio of the height of the prominence and depression pattern to the width of the prominence and depression pattern is approximately 10:1.

According to an aspect of the present invention, the height of the prominence and depression pattern is in the range of approximately 1000 Å to 5000 Å.

According to an aspect of the present invention, the prominence and depression pattern comprises at least one of $SiN_x$, $SiO_2$ and $SiON$.

According to an aspect of the present invention, the thin film transistor comprises a drain electrode, the inorganic insulating layer having a drain contact hole exposing the drain electrode.

The foregoing and/or other aspects of the present invention are also achieved by providing a fabricating method for a thin film transistor substrate comprising according to an embodiment: forming a gate wire on an insulating substrate; forming a data wire crossed with the gate wire and defining a pixel area; forming a thin film transistor on the intersection of the gate wire and the data wire; forming an inorganic insulating layer covering the thin film transistor; forming a prominence and depression pattern on the surface of the inorganic insulating layer; and forming a reflective layer on the prominence and depression pattern.

According to an aspect of the present invention, forming the prominence and depression pattern comprises forming an organic photosensitive layer on the inorganic insulating layer, disposing a mask for the diffraction exposure over the organic photosensitive layer, forming a photosensitive layer pattern corresponding to the prominence and depression pattern by exposing the organic photosensitive layer to light through the mask and developing the organic photosensitive layer, and etching the inorganic insulating layer through the photosensitive layer pattern.

According to an aspect of the present invention, the mask comprises a slit mask including a blocking part, a slit part and a transmitting part, and the ratio of the width of the blocking part to the width of the slit part is approximately 3:4.

According to an aspect of the present invention, the slit part is provided into the structure that the gap between slits is getting wider, as the slit part is far from the blocking part.

According to an aspect of the present invention, the mask comprises a halftone mask including a blocking part, semi-transmitting part and a transmitting part, and the ratio of the width of the blocking part to the width of the semi-transmitting part is approximately 3:4.

According to an aspect of the present invention, the semi-transmitting part is provided into the structure that the transmittance is getting higher, as the semi-transmitting part is far from the blocking part.

According to an aspect of the present invention, the photosensitive pattern is formed to be tapered to the center of the prominence and depression pattern.

According to an aspect of the present invention, the mask is disposed over the inorganic insulating layer in the alignment that the center of the blocking part is corresponding to the center of the prominence and depression pattern.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to like elements throughout.

As to the following description, the expression that a layer is formed on another layer comprises not only two layers are contact but also the other layer is interposed between two layers.

Moreover, the following description discloses a liquid crystal display device among flat display devices as an embodiment. However, the point of the following description may be applied to the other flat display device such as an organic light emitting diode and a plasma display panel. The following description discloses a transreflective type liquid crystal display device as an embodiment, but a reflective type liquid crystal display device also applied to.

Figure 1:
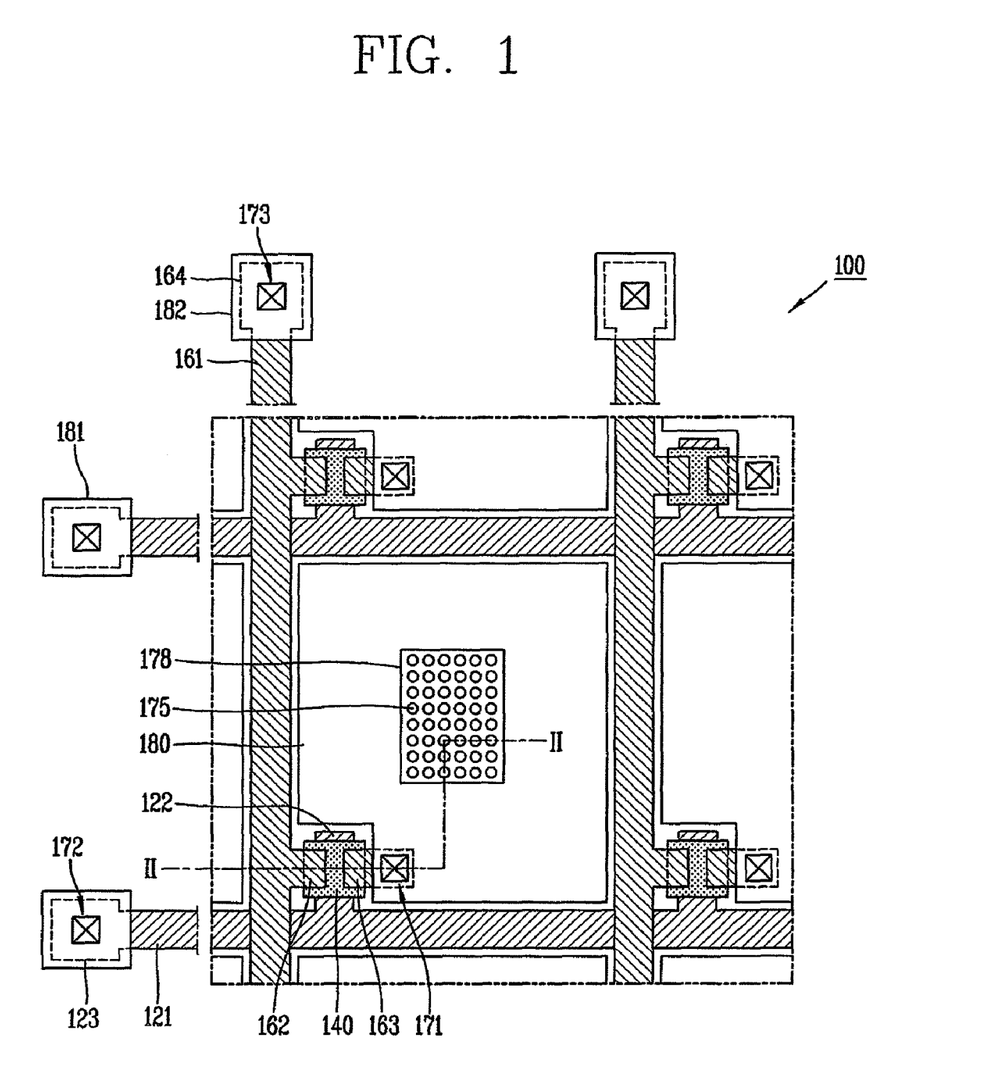
FIG. 1 is a schematic view illustrating a thin film transistor substrate according to the present invention.
Figure 2:
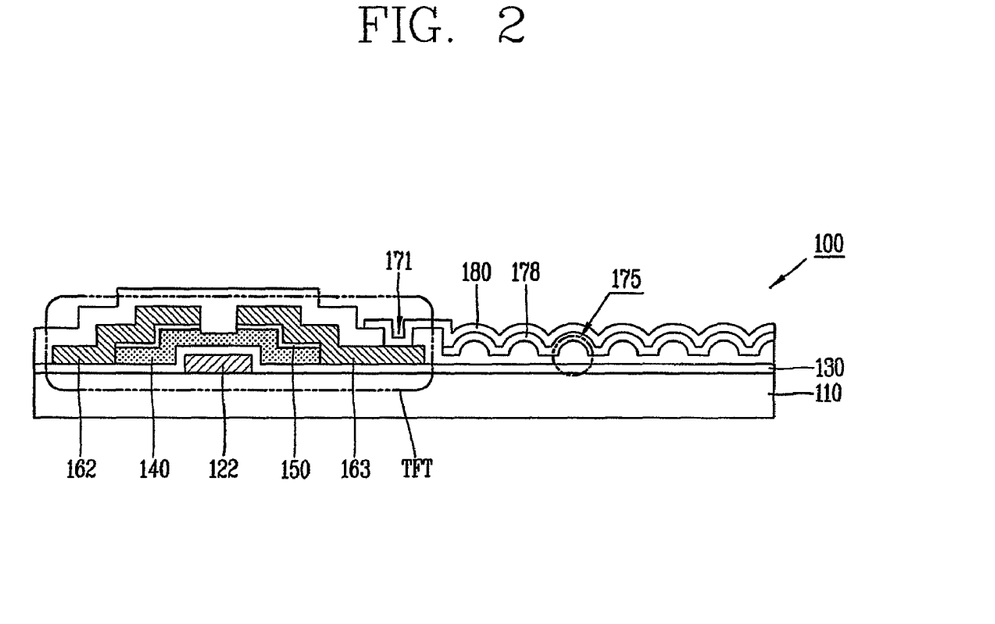
FIG. 2 is a sectional view of a liquid crystal display device along line II-II in FIG. 1.

FIG. 1 is a schematic view illustrating a thin film transistor substrate according to an embodiment of the present invention. FIG. 2 is a sectional view of a liquid crystal display device along line II-II in FIG. 1.

Generally, the liquid crystal display device comprises a liquid crystal display panel and a back light unit. The liquid crystal display panel comprises a thin film transistor substrate 100 comprising a thin film transistor (TFT) (T) as a switching and a driving device for driving and controlling each pixel, a color filter substrate (not shown) aligned to and adhered to the thin film transistor substrate 100, and a liquid crystal layer (not shown) sandwiched between the thin film transistor substrate 100 and the color filter substrate. The backlight unit is disposed at the rear of the liquid crystal display panel for providing light to the rear of the thin film transistor substrate 100 because the liquid crystal display panel is not a self-radiating device.

The thin film transistor substrate 100 comprises an insulating substrate 110, a lot of gate wires 121, 122, 123 and a lot of data wires 161, 162, 163, 164 are provided on the insulating substrate 110 in matrix formation, the thin film transistor (TFT) (T) formed at a crossed area of the gate wire 121, 122, 123 and the data wire 161, 162, 163, and a pixel electrode 180 connected to the thin film transistor (T). An electric field is occurred through voltage differences between the pixel electrode 180 and a common electrode (not shown), and liquid crystal molecules in liquid crystal layer (not shown) are aligned according to the electric field. A transmittance of light passing through the liquid crystal display panel is controlled according to the alignment of the liquid crystal molecules.

The insulating substrate 110 comprising an insulating material such as glass, quartz, ceramic and plastic. It is preferable but not necessary that the plastic substrate employed as the insulating substrate 110 when the thin film transistor substrate 100 according to the present invention is applied to a flexible liquid crystal display device. The plastic substrate may comprise at least one of polycarbonate, polyamide, polynorborneen (PNB), PES, PAR, polyethylenapthanate (PEN), and polyethylene terephthalate (PET).

The gate wire 121, 122, 123 is formed on the insulating substrate 110. The gate wire 121, 122, 123 may be formed as a layer or multi-layer. The gate wire 121, 122, 123 comprises a gate line 121 formed in a horizontal direction, a gate electrode 122 connected to the gate line 121, and a gate pad 123 provided at the end of the gate line 121. The gate pad 123 is connected to a gate driver (not shown) and supplied a gate signal from the gate driver (not shown).

A gate insulating layer 130 comprises SiNx and $SiO_2$, and covers the gate wire 121, 122, 123 on the insulating substrate 110.

A semiconductor layer 140 comprising amorphous silicon or poly silicon is formed on the insulating layer 130 of the gate electrode 122. An ohmic contact layer 150 comprising n+ hydrogenated amorphous silicon doped with silicide or n type dopant is formed on the semiconductor layer 140. The ohmic contact layer 150 is removed at channel area defined as a space between a source electrode 162 and a drain electrode 163.

The data wire 161, 162, 163, 164 is formed on the ohmic contact layer 150 and the gate insulating layer 130. The data wire 161, 162, 163, 164 may be formed as a layer or multi-layer comprising metals. The data wire 161, 162, 163, 164 comprises a data line 161 formed in a vertical direction to be crossed with the gate line 121 and defined a pixel area, a source electrode 162 branched out from the date line 161 and extended to on the ohmic contact layer 150, a drain electrode 163 separated form the source electrode 162 and formed on the ohmic contact layer 150 positioned on the opposite side of the source electrode 162, and a data pad 164 provided at the end of the data line 161. The data pad 164 is connected to a data driver (not shown) and supplied a data signal from the data driver (not shown).

An inorganic insulating layer 170 is formed on the data wire 161, 162, 163, 164 and the semiconductor layer 140 that is not covered with the data wire 161, 162, 163, 164. The inorganic insulating layer 170 comprises a drain contact hole 171 exposing the drain electrode 163, a gate pad contact hole 172 connected to the gate driver (not shown) for supplying the gate line 121 with the gate signal, a data pad contact hole 173 connected to the data driver (not shown) for supplying the data line 161 with the data signal, and a prominence and depression pattern 175. The prominence and depression pattern 175 formed on the inorganic insulating layer 170 diffuses light and enhances the reflexibility. Especially, the reflexibility of the front side is enhanced through the prominence and depression pattern 175.

Figure 3:
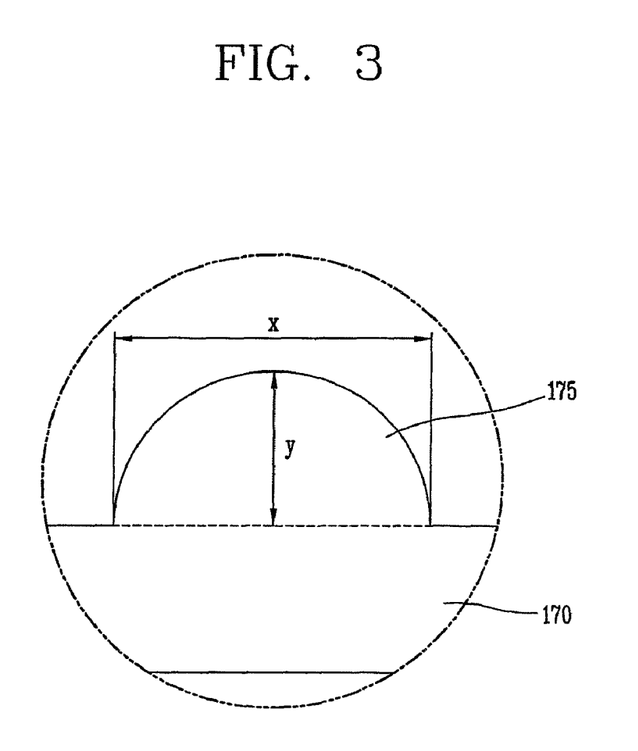
FIG. 3 is an exploded sectional view of a prominence and depression patter according to the present invention.

The prominence and depression pattern 175 according to the present invention, as shown in FIG. 3, is formed into an embossing shape with the width (x) and the height (y), and tapered to the center of the prominence and depression pattern 175. The prominence and depression pattern 175 is formed to have the ratio of the height (y) of the prominence and depression pattern 175 to the width (x) of the prominence and depression pattern 175 is 10:1 for achieving the optimum reflexibility. As an embodiment, the height (y) of the prominence and depression pattern 175 is in the range of 1000 Å to 5000 Å. The inorganic insulating layer 170 would be formed with the thickness of 1000 Å to 5000 Å because of the material characteristic of inorganic insulating materials. Thus, the prominence and depression pattern 175 would be formed with height (y) of 1000 Å to 5000 Å. In the other hand, the inorganic insulating layer 170 may be formed into the multilayers for forming the prominence and depression pattern 175 higher.

The reflective layer 178 is formed on the inorganic insulating layer 170 having the prominence and depression pattern 175. The pixel area defined by the gate line 121 and the data line 161 is divided into the transmittance area not covered with the reflective layer 178 and the reflective area covered with the reflective layer 178. Light of the backlight unit transmits the liquid crystal display panel at the transmittance area. Natural light entered to the liquid crystal display panel may be reflected from the reflective layer 178 and went out of the liquid crystal display panel at the reflective area. The reflective layer 178 is formed into a layer comprising aluminum or silver mainly, but two layers comprising a lower layer comprising aluminum and an upper layer comprising molybdenum in some cases. The prominence and depression pattern would be formed on the reflective layer 178 due to the prominence and depression pattern 175 of the inorganic insulating layer 170.

The pixel electrode 180 is formed on the reflective layer 175. The pixel electrode 180 comprises a transmittable material such as ITO (indium tin oxide) or IZO (indium zinc oxide). The pixel electrode 180 is connected to the drain electrode 163 electrically through the drain contact hole 171. A contact auxiliary member 181, 182 is formed on the gate pad contact hole 172 and the data pad contact hole 173. The contact auxiliary member 181, 182 also comprises a transmittable material such as ITO (indium tin oxide) or IZO (indium zinc oxide). The prominence and depression pattern 175 would be formed on the pixel electrode 180 due to the prominence and depression pattern 175 of the reflective layer 178.

The following is an illustration for the fabrication method of the thin film transistor substrate according to the first embodiment of the present invention.

First, as shown in FIG. 1 and FIG. 2, a gate wire material is formed on the insulating substrate 110, and then the gate wire 121, 122, 123 comprising the gate line 121, the gate electrode 122 and the gate pad 123 is formed by patterning the gate wire material through the photolithography with using mask.

After forming the gate wire 121, 122, 123, the gate insulating layer 130, the semiconductor layer 140 and the ohmic contact layer 150 are formed on the gate wire 121, 122, 123 and the insulating substrate 110 not covered with the gate wire 121, 122, 123 orderly. Afterward, the semiconductor layer 140 and the ohmic contact layer 150 are patterned to be remained only on the gate insulating layer 130 of the gate electrode 122.

Thereafter, a data wire material is formed on the insulating substrate 110, and then the data wire 161, 162, 163, 164 is formed by patterning the data wire material through the photolithography with using mask. The data wire 161, 162, 163, 164 comprises the data line 161 crossed to the gate line 121, the source electrode 162 branched out from the date line 161 and extended to on the ohmic contact layer 150, the drain electrode 163 separated from the source electrode 162 and formed on the ohmic contact layer 150 positioned on the opposite side of the source electrode 162, and the data pad 164 provided at the end of the data line 161. Afterward, the ohmic contact layer 150 is divided on either side of the semiconductor layer 140 by etching the ohmic contact layer 150 not covered with the data wire 161, 162, 163, 164, thereby exposing one part of the semiconductor layer 140. In this process, most of the ohmic contact layer 150 and a portion of the semiconductor layer 140 are removed. It is preferable but not necessary that oxygen plasma treatment is done for stabilizing the semiconductor layer 140 exposed. Thus, the thin film transistor (T) is fabricated.

Figure 4A:
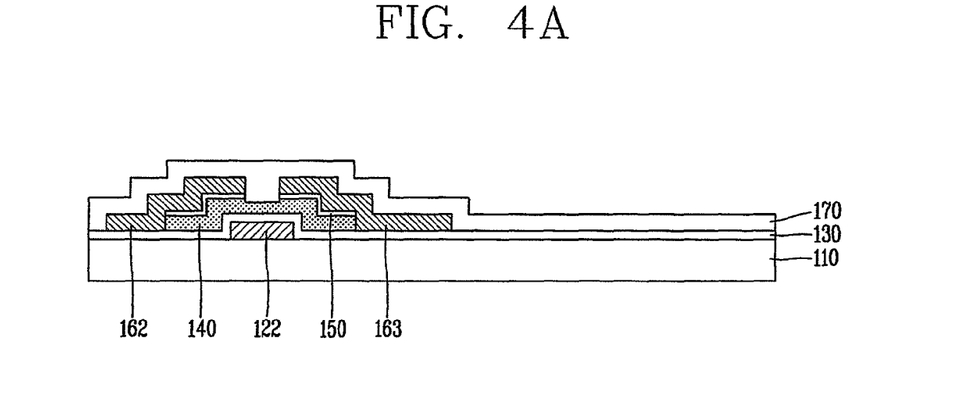
FIG. 4a through FIG. 4f are sectional views illustrating a fabricating method of the thin film transistor substrate in order according to a first embodiment of the present invention.

After fabricating the thin film transistor (T), as shown in FIG. 4a, the inorganic insulating layer 170 is formed to cover the thin film transistor (T) through PECVD (plasma enhanced chemical vapor deposition) on the pixel area. The inorganic insulating layer 170 is formed to have a thickness (d) of 1000 Å to 5000 Å.

Figure 4B:
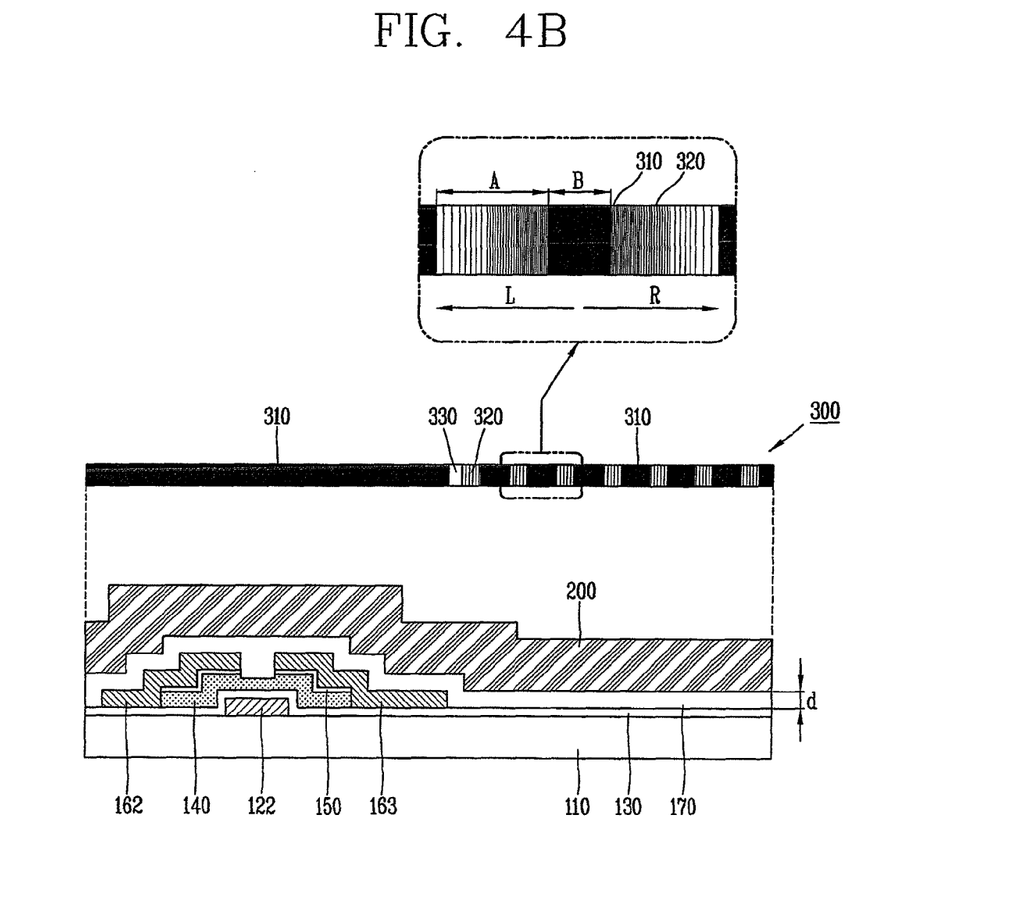

Afterward, as shown in FIG. 4b, an organic photosensitive layer 200 is formed on the inorganic insulating layer 170 through the slit coating method and the spin coating method, and then a mask 300 is disposed over the organic photosensitive layer 200. The organic photosensitive layer 200 may be a positive type that an exposed part is removed or a negative type that a non-exposed part is removed.

The mask 300 according to the present invention is the mask for the diffraction exposure such as a slit mask comprising a blocking part 310, a slit part 320 and a transmitting part 330. The mask 300 according to the present invention is disposed over the organic photosensitive layer 200 in the alignment that the center of the blocking part is corresponding to the center of the prominence and depression pattern 175. The ratio of the width (B) of the blocking part to the width (A) of the slit part is 3:4. The reason why the mask 300 has above the ratio is to form the photosensitive layer pattern 250 (refer to FIG. 4c) having a uniformed size through exposure and development of the organic photosensitive layer 200. The reason why the photosensitive layer pattern 250 (refer to FIG. 4c) is formed into a uniformed size is to form the prominence and depression pattern 175 (refer to FIG. 4d) having an optimum size (height: width=1:10) by etching process using the photosensitive layer pattern 250 (refer to FIG. 4c) as a mask, and form the prominence and depression pattern 175 (refer to FIG. 4d) having a uniformed size. The slit part 320 of the mask 300 according to the present invention is provided into the structure that the gap between slits is getting wider, as the slit part 320 is far from the blocking part 310. The reason why the slit part 320 having above structure is to differ the amount of exposure according to the position, thereby forming the photosensitive layer pattern 250 (refer to FIG. 4c) to be tapered through exposure and development of the organic photosensitive layer 200.

Figure 4C:
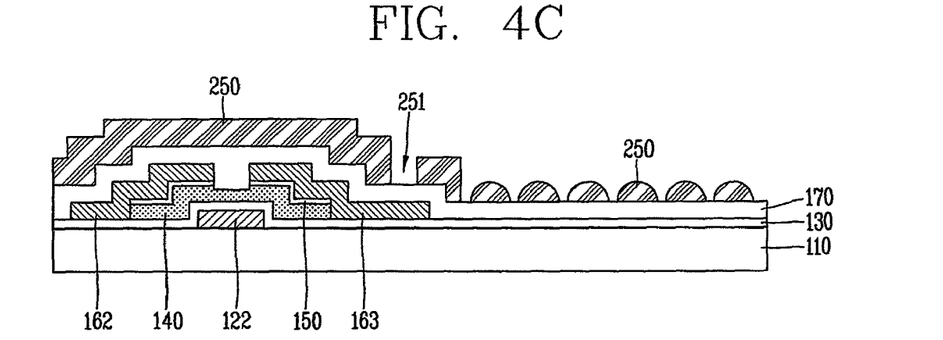

Thereafter, as shown in FIG. 4c, the photosensitive layer pattern 250 (refer to FIG. 4c) is formed through developing the exposed organic photosensitive layer 200 (refer to FIG. 4b). The photosensitive layer pattern 250 is provided on where the prominence and depression pattern 175 (refer to FIG. 4d) is formed and covering the thin film transistor (T). The photosensitive layer pattern 250 comprises an opening 251 exposing a part of the inorganic insulating layer 170 corresponding to the drain electrode 163 of the thin film transistor (T). The prominence and depression pattern 175 is formed tapered due to above structure of the slit part 320.

Figure 4D:
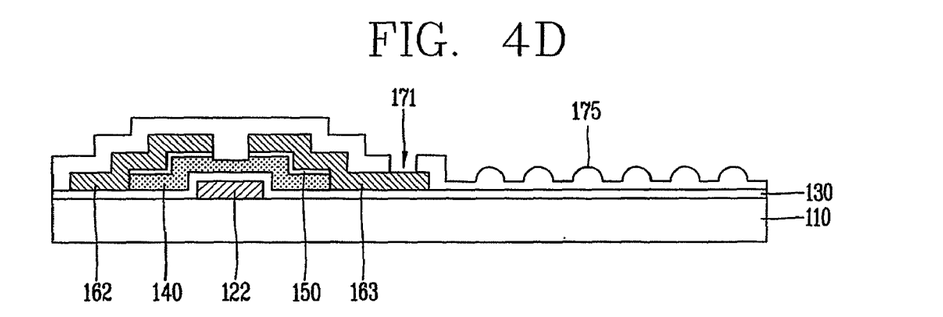

In the next time, as shown in FIG. 4d, the prominence and depression pattern 175, the drain contact hole 171, the data pad contact hole 173 (refer to FIG. 1), and gate pad contact hole 172 (refer to FIG. 1) is formed through etching the inorganic insulating layer 170 (refer to FIG. 4c) using the photosensitive layer pattern 250 (refer to FIG. 4c). In other words, the inorganic insulating layer 170 (refer to FIG. 4c) exposing by the photosensitive layer pattern 250 (refer to FIG. 4c) is removed. The inorganic insulating layer 170 (refer to FIG. 4c) disposing under the photosensitive layer pattern 250 (refer to FIG. 4c) is not removed or removed a little. More specifically, the inorganic insulating layer 170 (refer to FIG. 4c) where the photosensitive layer pattern 250 (refer to FIG. 4c) is thin is removed a little, and the inorganic insulating layer 170 (refer to FIG. 4c) where the photosensitive layer pattern 250 (refer to FIG. 4c) is thick is not removed. A dry etching method may be applied for removing the photosensitive layer pattern 250 (refer to FIG. 4c). Thus, the tapered prominence and depression pattern 175 is formed.

Figure 4E:
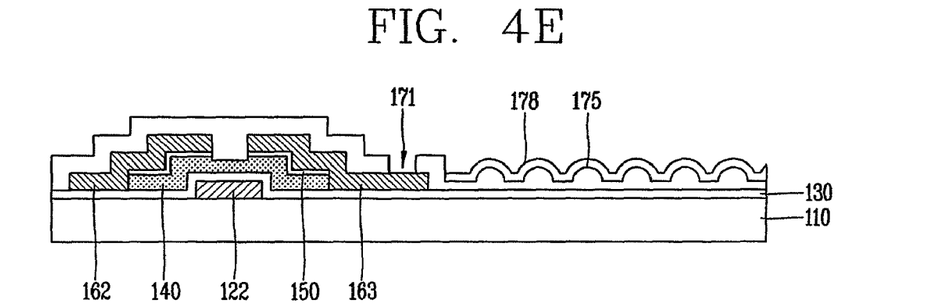

After forming the tapered prominence and depression pattern 175, as shown in FIG. 4e, the reflective layer 178 is formed to cover the prominence and depression pattern 175 on the entire surface of the inorganic insulating layer, and then the reflective layer 178 is patterned to remove the rest without the reflective layer 178 on the prominence and depression pattern 175. The reflective layer 178 is formed into a layer comprising aluminum or silver mainly, but two layers comprising a lower layer comprising aluminum and an upper layer comprising molybdenum in some cases. Light of the backlight unit transmits the liquid crystal display panel at the transmittance area where the reflective layer 178 is not formed on. Natural light entered to the liquid crystal display panel may be reflected from the reflective layer 178 and went out of the liquid crystal display panel at the reflective area where the reflective layer 178 is formed on.

Figure 4F:
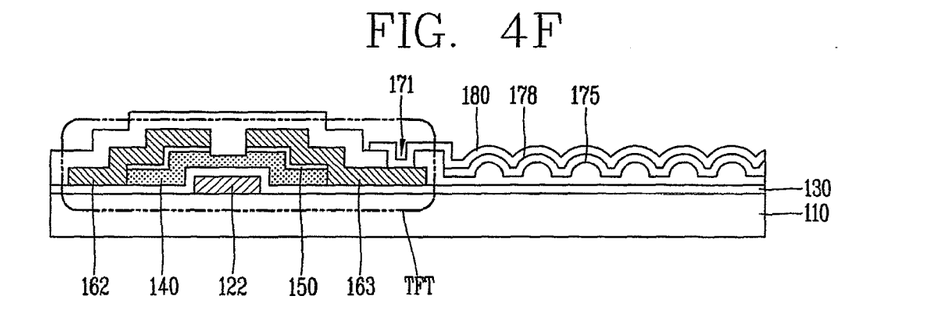

Afterward, as shown in FIG. 4f, the pixel electrode 180 is formed to cover the reflective layer 178 on the entire surface, and then the pixel electrode 180 is patterned to divide it according to each pixel electrode 180. The pixel electrode 180 comprises a transmittable material such as ITO (indium tin oxide) or IZO (indium zinc oxide). The pixel electrode 180 is connected to the drain electrode 163 electrically through the drain contact hole 171.

Hence, the thin film transistor substrate 100 is completed.

The following is an illustration for the fabrication method of the thin film transistor substrate according to the second embodiment of the present invention.

Features distinguished from the above embodiment may be described in the below described another embodiment, and omitted or comprised description parts are same with above first embodiment.

Figure 5:
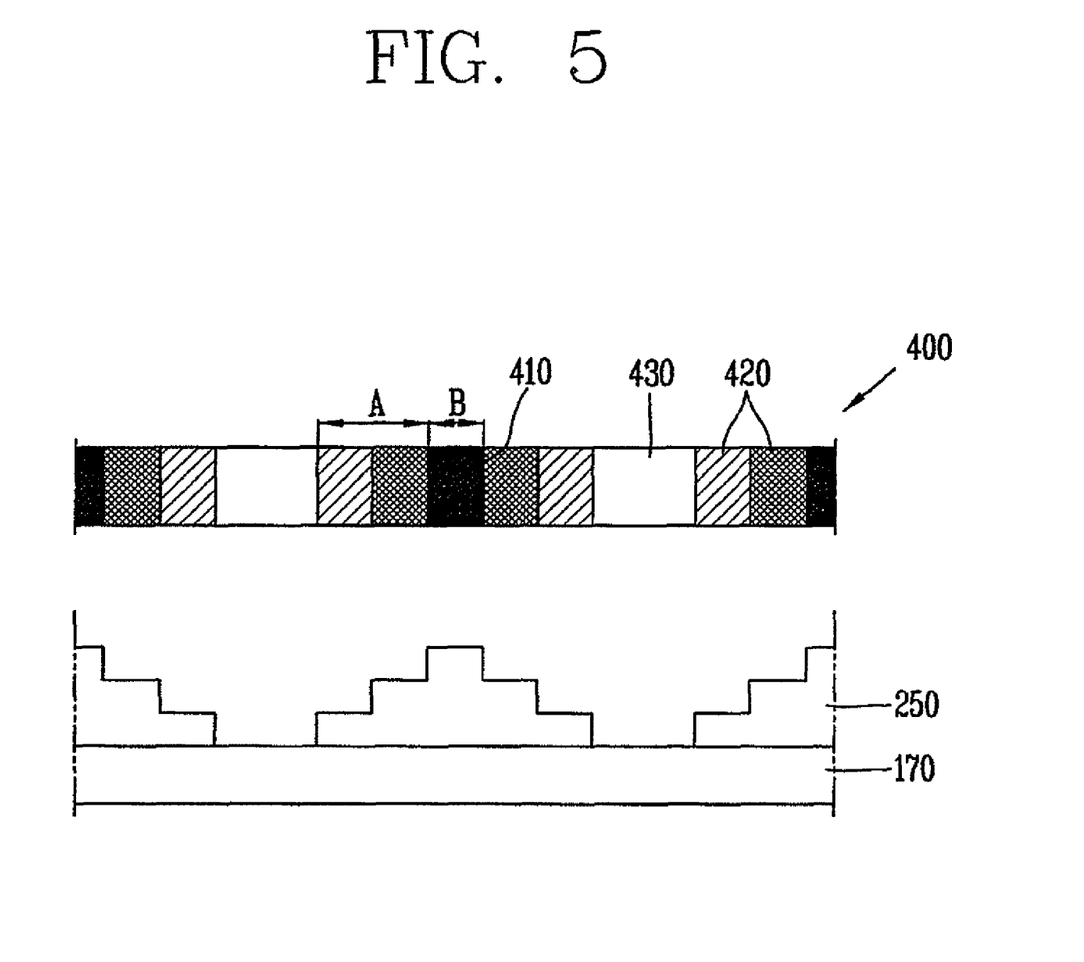
FIG. 5 is a sectional view illustrating a fabricating method of the thin film transistor substrate according to a second embodiment of the present invention.

The mask 400 according to the second embodiment comprises a halftone mask including a blocking part 410, semi-transmitting part 420 and a transmitting part 430, and the ratio of the width (B) of the blocking part 410 to the width (A) of the semi-transmitting part 420 is 3:4. The semi-transmitting part 420 is provided into the structure that the transmittance is getting higher, as the semi-transmitting part 420 is far from the blocking part 410. More specifically, as shown in FIG. 5, the semi-transmitting part 420 comprises a lot of sub-parts, and each sub-part has different transmittance. Transmittance of the sub-parts near to the blocking part 410 is low, and Transmittance of the sub-parts near to the transmitting part 430 is high relatively. Accordingly, as shown in FIG. 5, the photosensitive layer pattern 250 is formed into a stair-shape. Afterward, the photosensitive layer pattern 250 is transformed into an embossing-shape or a fluent curve formation by applying heat to the photosensitive layer pattern 250.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:
1. A thin film transistor substrate comprising:
a gate wire and a data wire formed to cross each other on an insulating substrate and define a pixel area;
a thin film transistor formed on the intersection of the gate wire and the data wire, the thin film transistor including:
a gate electrode on the insulating substrate;
a gate insulating layer over the gate electrode;
a semiconductor layer on the gate insulating layer; and
a source electrode and a drain electrode on the semiconductor layer;
an inorganic insulating layer covering the thin film transistor and having a lower surface and an upper surface, the lower surface being flat and the upper surface being formed in a prominence and depression pattern;
a reflective layer provided on the inorganic insulating layer, the reflective layer being contacted with the prominence and depression pattern of the upper surface of the inorganic insulating layer; and
a pixel electrode on the reflective layer in the pixel area to be contacted with the drain electrode of the thin film transistor through a contact hole formed in the inorganic insulating layer, the pixel electrode being formed in the prominence and depression pattern,
wherein the lower surface of the pixel electrode is contacted with the upper surface of the reflective layer, and
wherein the inorganic insulating layer is formed with a mask including a blocking part, a semi-transmitting part having a plurality of slit parts and a transmitting part, the ratio of the width of the blocking part to the width of the semi-transmitting part is 3:4, and a gap between the slits is different at both sides of the center of the semi-transmitting part, and
wherein the prominence and depression pattern of the upper surface of the inorganic insulating layer have a shape defined by the blocking part and the slit parts.

2. The thin film transistor substrate according to claim 1, wherein the prominence and depression pattern is provided in at least one part of the pixel area.

3. The thin film transistor substrate according to claim 1, wherein the prominence and depression pattern is formed into an embossing shape, the ratio of the height of the prominence and depression pattern to the width of the prominence and depression pattern is 10:1.

4. The thin film transistor substrate according to claim 3, wherein the height of the prominence and depression pattern is in the range of 1000 Å to 5000 Å.

5. The thin film transistor substrate according to claim 1, wherein the prominence and depression pattern comprises at least one of $SiNx$, $SiO_2$ and $SiON$.

* * * * *